United States Patent [19]
Chen et al.

[11] Patent Number: 5,856,277
[45] Date of Patent: Jan. 5, 1999

[54] SURFACE TEXTURING OF SUPERCONDUCTORS BY CONTROLLED OXYGEN PRESSURE

[75] Inventors: Nan Chen; Kenneth C. Goretta, both of Downers Grove; Stephen E. Dorris, La Grange Park, all of Ill.

[73] Assignee: Illinois Superconductor Corporation, Mt Prospect, Ill.

[21] Appl. No.: 657,415

[22] Filed: Jun. 3, 1996

[51] Int. Cl.[6] .................................. B05D 5/12; B05D 3/02
[52] U.S. Cl. .................... 505/452; 505/450; 505/733; 505/500; 505/501; 427/62
[58] Field of Search ................................. 505/450, 452, 505/733, 500, 501; 427/62

[56] References Cited

PUBLICATIONS

Dietderich et al, Jpn. J. Appl. Phys. vol. 29, No. 7, Jul. 1990, pp. L1100–L1103.
Xu et al, Appl. Phys. lett. 55 (21) Nov. 1989, pp. 2236–2238.

*Primary Examiner*—Roy V. King
*Attorney, Agent, or Firm*—Michael D. Rechtin

[57] ABSTRACT

A method of manufacture of a textured layer of a high temperature superconductor on a substrate. The method involves providing an untextured high temperature superconductor material having a characteristic ambient pressure peritectic melting point, heating the superconductor to a temperature below the peritectic temperature, establishing a reduced $pO_2$ atmosphere below ambient pressure causing reduction of the peritectic melting point to a reduced temperature which causes melting from an exposed surface of the superconductor and raising pressure of the reduced $pO_2$ atmosphere to cause solidification of the molten superconductor in a textured surface layer.

22 Claims, 8 Drawing Sheets

SURFACE TEXTURING OF SUPERCONDUCTORS BY CONTROLLED OXYGEN PRESSURE

Certain rights in this invention are retained by the U.S. Government pursuant to Contract W-31-109-ENG-38 from the U.S. Department of Energy.

The present invention is concerned with surface texturing of high temperature superconductors. More particularly the invention is concerned with a method of manufacture of an article comprised of a surface textured high temperature superconductor, such as rare earth superconductors and a $YBa_2Cu_3O_{7-x}$ (123-YBCO) superconductor.

Melt texturing of high temperature superconductors, such as 123-YBCO, can produce large, well aligned grains. In this process, "textured" 123-YBCO is produced by crystallizing this compound out of its peritectic mixture of $Y_2BaCuO_5$ plus a Ba/Cu-rich liquid. Many variations of this technique have been described, and it is commonly practiced in laboratories throughout the world. However, the process remains essentially the same as that originally developed in 1988.

The melt-texturing process typically involves heating a sample above the peritectic temperature (1015° C. in air for the YBCO system) to decompose the 123-YBCO into $Y_2BaCuO_5$ plus liquid. This mixture is cooled slowly through the peritectic temperature allowing 123-YBCO to crystallize. When this cooling is performed in the presence of a thermal gradient, the 123-YBCO grains preferentially grow parallel to the gradient and a "textured" microstructure results. The slow cooling keeps the nucleation rate of 123-YBCO low, resulting in the formation of a small number of nuclei. As a result, the 123-YBCO grains can grow to very large sizes before impingement; and if the cooling is performed in a thermal gradient, the grains will be highly aligned. In the originally developed process, samples were measured to have critical currents of up to 17,000 $A/cm^2$ in self-field with only a small magnetic field dependence. Improvements to this process (which have included the production of continuous lengths of melt-textured filaments) have resulted in measured current densities as high as 140,000 $A/cm^2$ in self field and 44,000 $A/cm^2$ in a 1 Tesla field at 77 K.

While the melt-texturing process has proven to be very effective in the fabrication of bulk 123-YBCO having properties approaching those of thin film materials, it has substantial drawbacks. First, melt-texturing is essentially a crystal growth process in which the rate of material production is controlled by the velocity of the crystallization front. In the case of 123-YBCO crystallizing out of its peritectic mixture, the crystal growth rate is extremely sluggish. Even in extremely large thermal gradients ($10^7 K/m$) growth rates of only 1.2 cm/hr have been achieved. A second problem, of particular importance to texturing thick film structures, is the fact that the melt-texturing process requires processing at temperatures above 1000° C. in the presence of the extremely reactive peritectic liquid. This severely limits the choice of substrate materials that can be used without reacting with the superconductor. To date, only zirconia and magnesia have been used with any degree of success; and these ceramics are expensive and difficult to process and also can contaminate the superconductor.

In processing of 123-YBCO, one of the most promising processes has been a seeded growth technique which produces single-domain YBCO disks about 1 to 2 inches in diameter. These disks are used for flywheel applications. However, due to limitations in size and shape of materials needed for flywheel applications, the process is not feasible for RF applications where customized, complex geometries are often required.

It is therefore an object of the invention to provide an improved method of producing a high temperature superconductor (HTSC) material.

It is a further object of the invention to provide a novel method of producing an HTSC material at relatively low temperatures with very high rate of production and diminished interactions with substrate materials.

It is another object of the invention to provide an improved method of producing HTSC structures on relatively inexpensive substrates.

It is yet a further object of the invention to provide a novel HTSC article of manufacture.

It is still an additional object of the invention to provide an improved method of manufacturing HTSC material and an article of manufacture of rare earth or YBCO superconductors.

It is still a further object of the invention to provide a novel article and method of manufacture of HTSC material having a peritectic phase diagram.

It is an additional object of the invention to provide an improved article and method of manufacture of an HTSC material by controlled heating in a peritectic phase system, controlled reduction of $pO_2$ above the HTSC material to cause HTSC melting and increasing the $pO_2$ to solidify the HTSC material into a textured thick film on a substrate.

It is also a further object of the invention to provide an article and method of manufacture of complex geometries for HTSC materials.

Further objects and advantages of the present invention, together with the organization and manner of operation thereof, will become apparent from the following detailed description of the invention when taken in conjunction with the accompanying drawings, wherein like elements have like numerals throughout the drawings.

BRIEF DESCRIPTION OF THE DRAWINGS

FIG. 3 illustrates various microstructures for 123-YBCO processed at 960° C. in 2 torr of $O_2$ and crystallized by raising the $pO_2$ to atmospheric pressure with FIG. 3(a) illustrating the result for 0.2 hours time to reach atmospheric pressure and FIG. 3(b) illustrating the result for 8 hours time to reach atmospheric pressure

DETAILED DESCRIPTION OF PREFERRED EMBODIMENTS

A high temperature superconductor ("HTSC"), having an associated peritectic phase diagram, such as $YBa_2Cu_3O_{7-x}$ ("123-YBCO"), can be processed to produce a relatively thin (e.g., 0.1–1 mm thick), textured film of the HTSC with large grains on the surface of an underlying 123-YBCO material. Other exemplary peritectic phase systems are (RE)$Ba_2Cu_3O_{7-x}$ where RE=Nd, Sm, Yb or Dy. This methodology leaves the material below the textured layer in a substantially unaltered state. This process therefore avoids problems associated with HTSC/substrate interactions since the textured layer is separated from an underlying substrate (such as silver), and the temperature of processing is below the ambient-pressure temperature (e.g., below 1015° C. in a 123-YBCO system).

Figure 1:
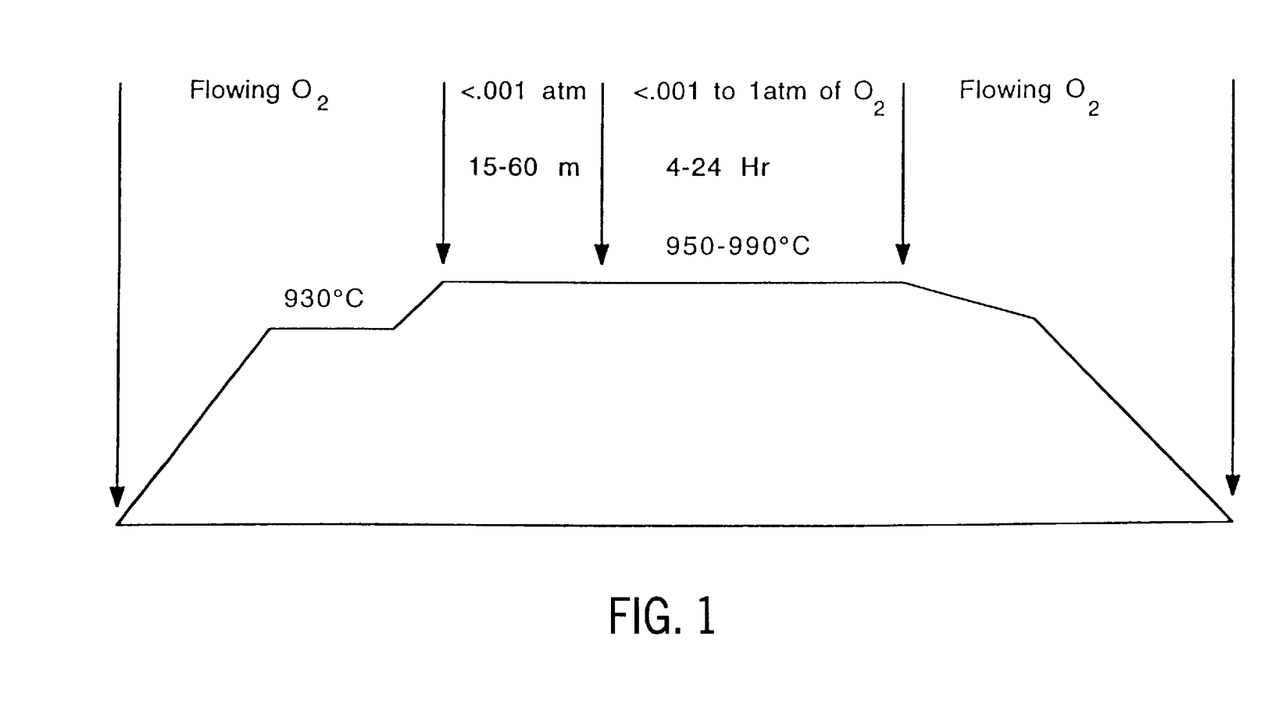
FIG. 1 illustrates an exemplary temperature/$pO_2$ processing schedule for a preferred form of the invention with the temperature axis shown vertically.
Figure 2:
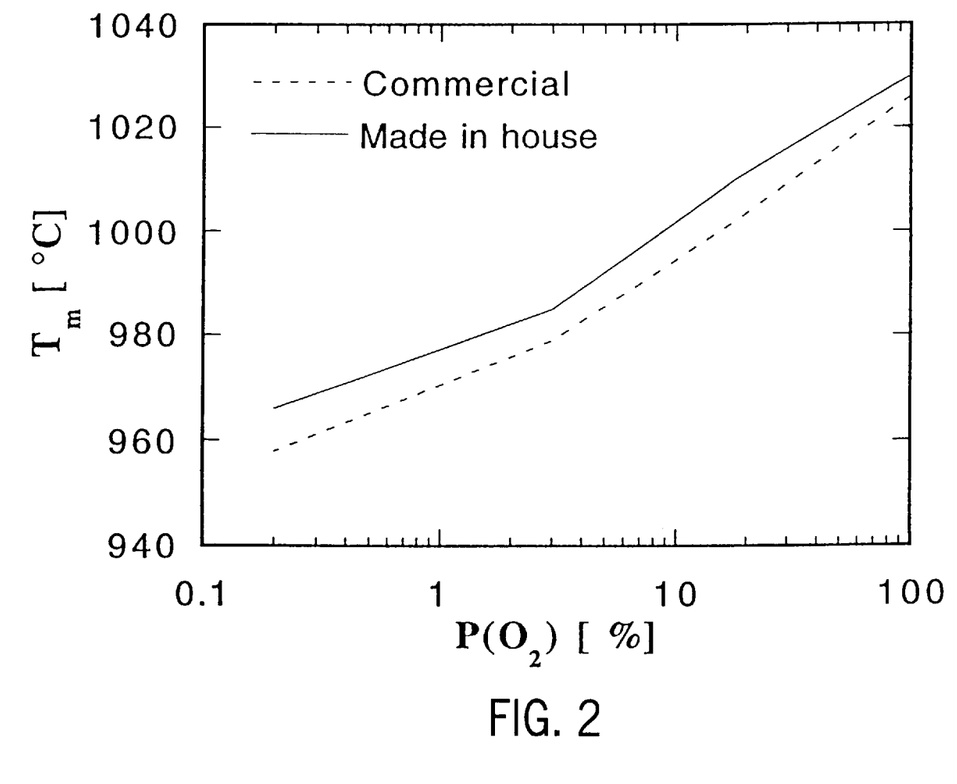
FIG. 2 shows the peritectic melting temperature of 123-YBCO as a function of $pO_2$.

In the method of the invention a starting HTSC material, such as a sintered 123-YBCO, is heated to about 930° C. in flowing $O_2$ as shown in FIG. 1. Note the variation of the melting point of 123-YBCO as a function of $pO_2$ shown in FIG. 2. Therefore, the temperature can be raised while the $pO_2$ of air (0.21 atm) is raised to higher pressures, such as a $pO_2$=1.0 atm. The pressure can then be reduced, such as by evacuation, and a controlled amount of oxygen is introduced. In the temperature range of about 950°–990° C., the $pO_2$ is below atmospheric pressure such that the temperature is above the melting point in accordance with FIG. 2. In a most preferred embodiment, the $pO_2$ is less than 0.01 atm for a period of 15–60 minutes, and the 123-YBCO material thus begins to undergo melting from the surface as oxygen diffuses out of the starting 123-YBCO material. The kinetics of the melting process are determined by the kinetics of oxygen diffusion in solid 123-YBCO, these kinetics being very different from heat transport through 123-YBCO (or any HTSC material).

Control of the depth of a textured layer on the starting HTSC material is dictated by (a) the $pO_2$ over the HTSC material, (b) the temperature and (c) the time at the reduced $pO_2$ and temperature. Consequently, the depth of the final textured layer can readily be controlled. As shown in FIG. 1, the $pO_2$ and temperature is preferably maintained for about 15–60 minutes.

Once a desired textured layer thickness of melted HTSC has been achieved, the $pO_2$ can be raised to achieve solidification. Preferably, in the 123-YBCO system this involves increasing the $pO_2$ above 0.01 atm with temperature maintained for about 3–23 hours (although about 1–3 hours and more than 23 hours also produce a textured layer). Further, the temperature can be kept constant or vary during the process, provided the fundamental process steps are still performed, that is, a temperature between about 930°–990° C. is used to keep the 123-YBCO material below the peritectic melting point.

Figure 3A:
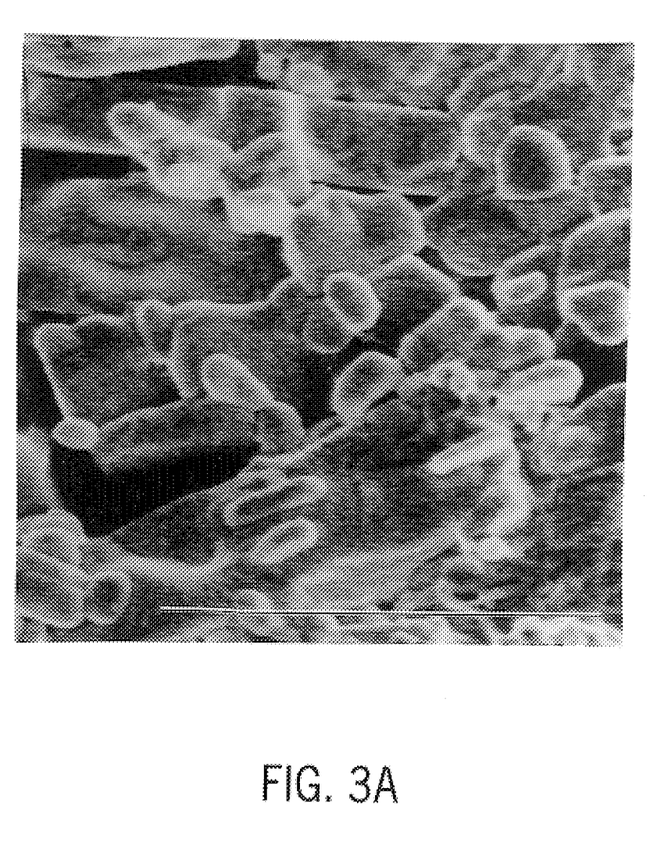
Figure 3B:
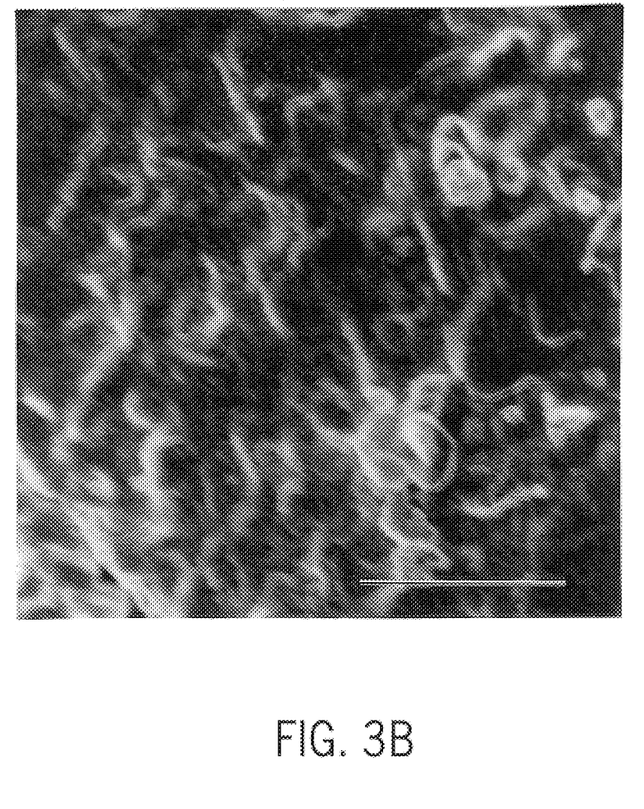
Figure 3C:
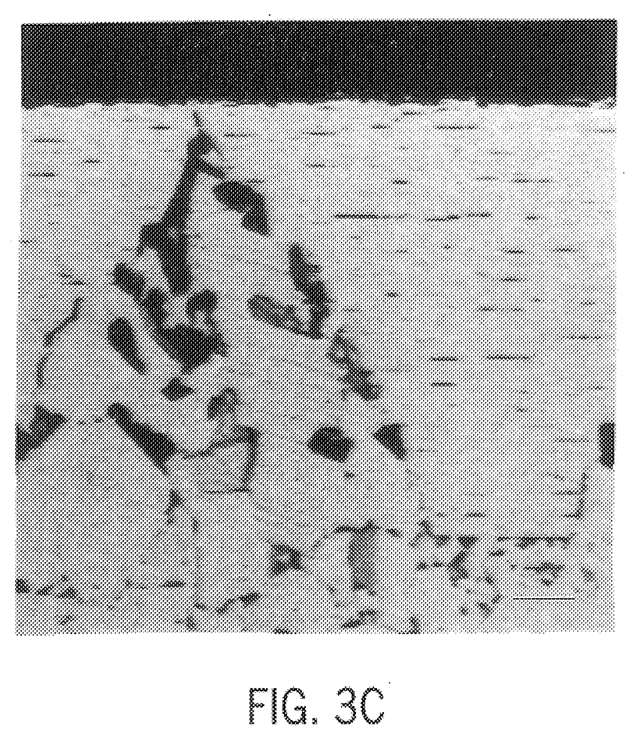
FIG. 3(c) is a perpendicular cross-sectional view of the microstructure of FIG. 3(b) with the bar in each view equal to 50 microns.

After solidification, the 123-YBCO material with the surface textured layer can be subjected to a flowing $O_2$ atmosphere, and the temperature is reduced to room temperature, for example in the manner shown in FIG. 1. Representative microstructures of 123-YBCO surface textured specimens are shown in FIG. 3.

The resulting 123-YBCO specimens prepared in accordance with a method of the invention underwent surface resistance testing at 2.84 GHz at 77° K. These specimens exhibited a very low surface resistance (about 100 microohms) compared to sintered 123-YBCO and copper, and compared quite favorably to thin film 123-YBCO which is expected to have very low surface resistance and is in effect a standard of merit.

Figure 4:
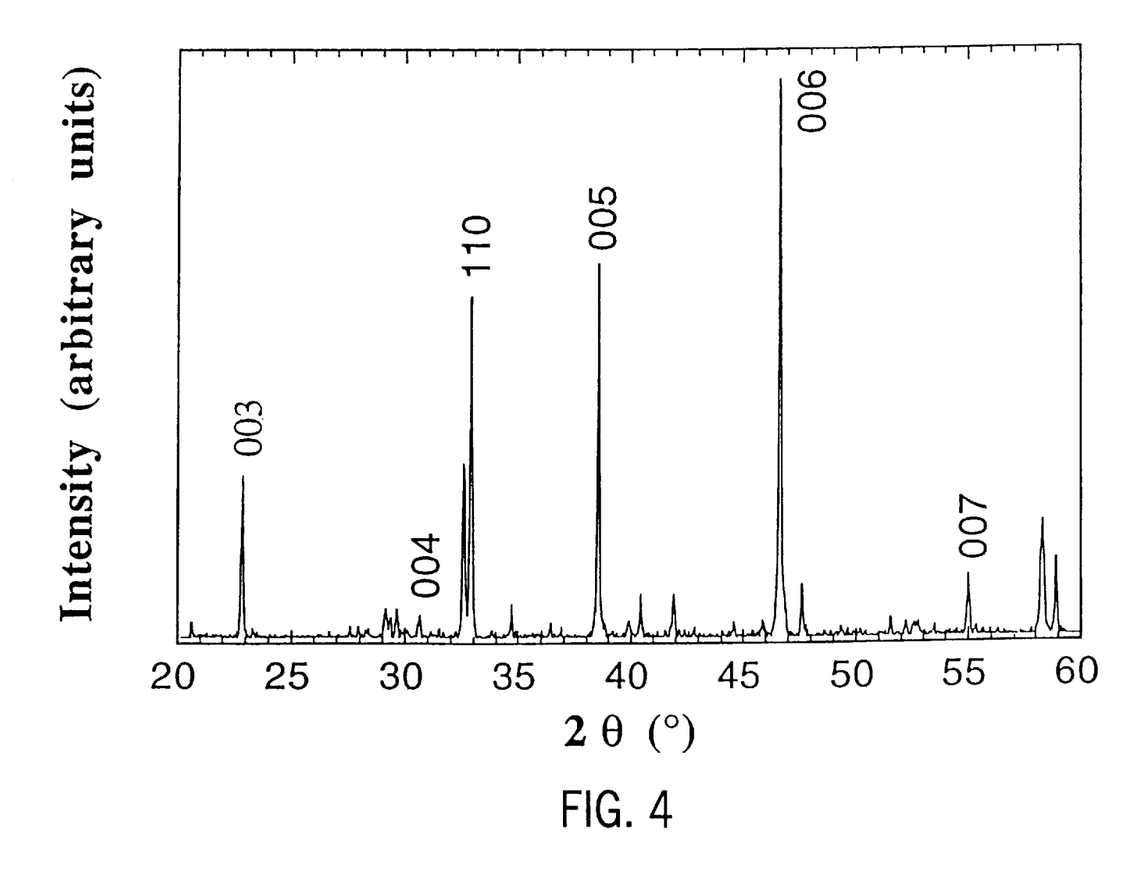
FIG. 4 illustrates an exemplary X-ray diffraction curve showing the textured nature of an HTSC material prepared by one of the methods of the invention.
Figure 5:
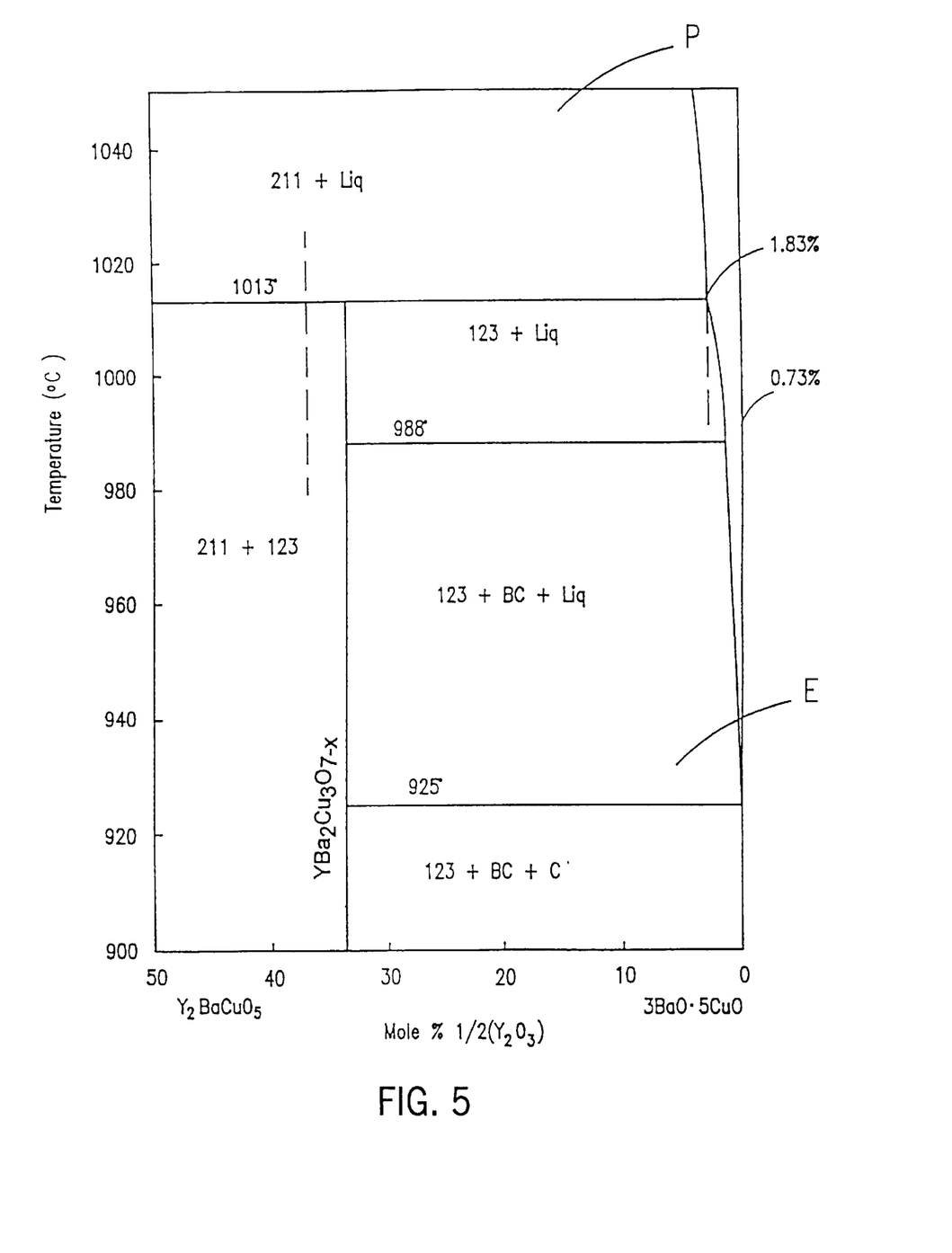
FIG. 5 illustrates a pseudobinary phase diagram of $Y_2BaCuO_5$ and $3BaO.5CuO$.

The textured nature of the surface layer in the 123-YBCO system is illustrated in the X-ray diffraction pattern of FIG. 4. The layer shows a highly preferred C-axis texture which is desired in such HTSC structures.

The following nonlimiting example illustrates various aspects of the invention.

EXAMPLE

123-YBCO powder was pressed into pellets which were placed on MgO single crystals and sintered at 930° C. in $O_2$. The pellets could also be cold formed (rather than sintered) or otherwise processed to achieve a dense material for further treatment in accordance with the invention. Final densities were >6 g/cm$^3$; and pellet thicknesses were about 3–5 mm. The pellets were again placed on MgO crystals and heated in flowing $O_2$ to 960°–970° C. A vacuum was quickly drawn, and then the pressure was stabilized at 2 torr of $O_2$. The pellets were then held at temperature for about 8.5 h. Solidification was accomplished by decreasing the vacuum in stages, and for most pellets, the $pO_2$ was doubled periodically. The time to reach atmospheric pressure ranged from 0.2 to 8 h. Once the pellets were solidified isothermally, the pellets were cooled to 450° C. and were given a final anneal in $O_2$ at 450° C.

Figure 6:
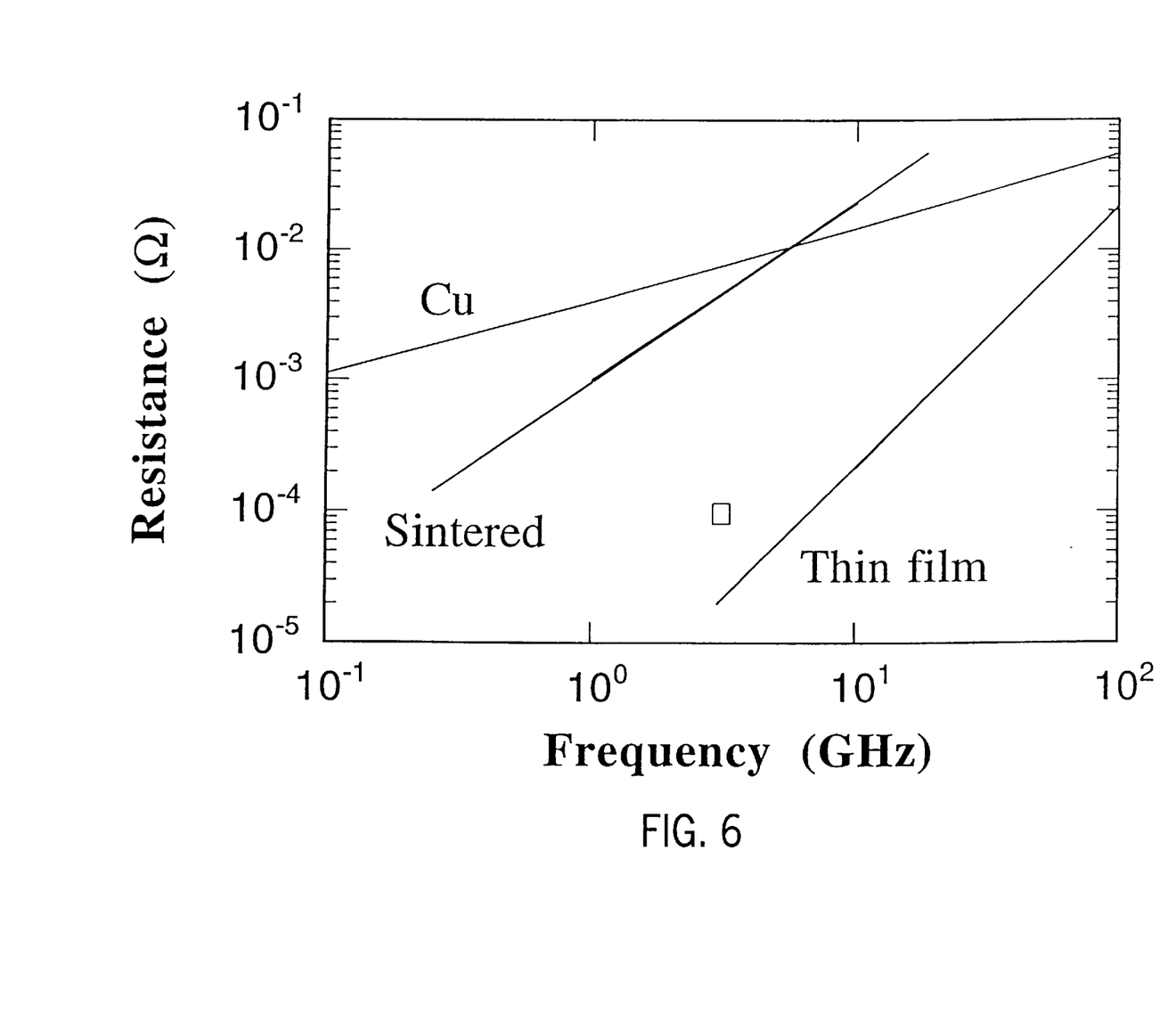
FIG. 6 shows surface RF resistance at 2.84 GHz for textured 123-YBCO specimens of the invention, a prior art sintered 123-YBCO, a thin film of 123-YBCO and Cu.

The resulting pellets were examined by scanning electron microscopy (SEM) and are shown in FIG. 3. The results for X-ray diffraction (XRD) for the pellet solidified over 8 h of isothermal treatment are shown in FIG. 4. Surface resistance was examined at 2.84 GHz. Measurements were made with a $TiO_2$ dielectric resonator operated in the $TE_{011}$ mode, and the results are shown in FIG. 6.

These heat treatments induced melting and resolidification of surface layers only. The pellets exhibited very little change in size or shape. In 2 torr of $O_2$, 0.5 h at 960°–970° C., the result was a molten layer of <1 mm. SEM revealed that pellets for which the $pO_2$ was raised to atmospheric pressure quickly (0.2 h) consisted of large grains that were often oriented substantially randomly. Voids and regions of second phases were present where these grains met. In contrast, for pellets in which 8 h was spent to increase the $pO_2$ to atmospheric pressure, the grains exhibited much better alignment, with the c axes of the grains perpendicular to the pellet surface; and less second phase was present (see FIG. 4). X-ray diffraction confirmed the SEM observations (see FIGS. 3 and 4). For the better pellets, the RF surface resistances at 2.84 GHz were as low as 100 $\mu\Omega$ at 77° K (see FIG. 6). This value is much lower than those of copper or polycrystalline Y-123, but is higher than that of good Y-123 thin films.

While preferred embodiments of the invention have been shown and described, it will be clear to those skilled in the art that various changes and modifications can be made without departing from the invention in its broader aspects as set forth in the claims provided hereinafter.

What is claimed is:

1. A method of preparing a textured layer of a high temperature superconductor on a substrate, comprising the steps of:

providing an untextured high temperature superconductor having a characteristic ambient pressure peritectic melting point;

heating said superconductor to a temperature below the peritectic temperature;

establishing a reduced $pO_2$ atmosphere below atmospheric pressure thereby causing reduction of the peritectic melting point to a reduced peritectic temperature point thereby causing melting from an exposed surface of said superconductor; and raising pressure of the reduced $pO_2$ atmosphere to cause solidification of molten superconductor in a textured surface layer on the substrate.

2. The method as defined in claim 1 wherein said high temperature superconductor is a rare earth-123 superconductor.

3. The method as defined in claim 2 wherein said substrate consists essentially of the same composition as said solidified high temperature superconductor textured surface layer.

4. The method as defined in claim 3 wherein said textured surface layer is an integral part of said substrate.

5. The method as defined in claim 1 wherein said untextured high temperature superconductor comprises a dense material having a density of greater than about 60% of fully compacted material.

6. The method as defined in claim 5 wherein said dense material is formed by at least one of cold forming and sintering.

7. The method as defined in claim 1 further including the step of reducing temperature while raising $pO_2$ pressure to cause solidification of the surface layer.

8. The method as defined in claim 1 wherein said high temperature superconductor is further subjected to a vacuum before providing a reduced $pO_2$ atmosphere.

9. The method as defined in claim 1 wherein said untextured superconductor comprises a polycrystalline specimen.

10. The method as defined in claim 1 wherein the reduced $pO_2$ atmosphere is less than about 0.1 atmosphere.

11. The method as defined in claim 1 wherein the high temperature superconductor comprises a 123-YBCO superconductor and the temperature of heating ranges between 950° C.–990° C. during at least part of the time of the heating step.

12. The method as defined in claim 1 wherein said exposed surface is adjacent to the reduced $pO_2$ atmosphere.

13. A method of preparing a textured layer of a high temperature superconductor on an untextured high temperature superconductor substrate with the superconductor having a characteristic peritectic phase diagram, comprising the steps of:

providing a substrate of an untextured high temperature superconductor specimen;

disposing said substrate in a first $pO_2$ atmosphere having a first pressure and then reducing the $pO_2$ pressure below the first pressure to a reduced gas pressure, said reduced gas pressure causing controlled reduction of the peritectic melting point of said high temperature superconductor substrate below its ambient pressure peritectic melting point;

subjecting said high temperature superconductor substrate to an elevated temperature below the ambient pressure peritectic melting point but above the reduced gas pressure peritectic melting point to cause melting from an exposed surface of said high temperature superconductor substrate adjacent the reduced gas pressure; and raising the $pO_2$ pressure of the reduced gas pressure to cause solidification of molten high temperature superconductor formed in a surface layer on said high temperature superconductor substrate, thereby forming said textured layer of high temperature superconductor on the untextured high temperature superconductor substrate.

14. The method as defined in claim 13 wherein said textured layer comprises a layer integrally bonded to said substrate.

15. The method as defined in claim 13 wherein said substrate consists essentially of a rare earth superconductor.

16. The method as defined in claim 15 wherein said substrate comprises 123-YBCO.

17. A method of preparing a textured layer of a high temperature superconductor of rare earth-123 superconductor, comprising the steps of:

providing an untextured high temperature superconductor specimen;

disposing said superconductor specimen in a $pO_2$ atmosphere and heating to a temperature below the peritectic melting point of said superconductor in said $pO_2$ atmosphere;

lowering pressure of the $pO_2$ atmosphere above said superconductor specimen to cause reduction of the peritectic melting point and to cause melting from an exposed surface of said superconductor specimen and formation of a molten superconductor layer; and raising pressure of the $pO_2$ atmosphere to cause solidification of the molten superconductor layer in a textured surface layer of said specimen.

18. The method as defined in claim 17, further including the step of reducing temperature while raising the pressure of the $pO_2$ atmosphere to cause the solidification of the molten superconductor layer.

19. The method as defined in claim 17 further including said superconductor specimen being disposed on a substrate.

20. The method as defined in claim 17 further including a substrate consisting essentially of a composition the same as said textured layer.

21. The method as defined in claim 17 wherein said superconductor comprises a mixture of different high temperature superconductors.

22. The method as defined in claim 17 wherein said step of heating includes varying temperatures below the peritectic melting point while maintaining the superconductor in a molten state.

* * * * *